United States Patent [19]
Yokouchi et al.

[11] Patent Number: 5,275,889
[45] Date of Patent: Jan. 4, 1994

[54] MULTI-LAYER WIRING BOARD

[75] Inventors: Kishio Yokouchi; Hiroshi Kamezaki; Masato Wakamura; Nobuo Kamehara; Koichi Niwa, all of Kawasaki, Japan

[73] Assignee: Fujitsu Limited, Kawasaki, Japan

[21] Appl. No.: 763,248

[22] Filed: Sep. 20, 1991

[30] Foreign Application Priority Data

Sep. 20, 1990 [JP] Japan .................. 2-252500

[51] Int. Cl.⁵ .................................. B32B 9/00
[52] U.S. Cl. .................... 428/426; 428/209; 428/210; 428/323; 428/406; 428/901
[58] Field of Search .............. 428/426, 209, 210, 323, 428/901, 406

[56] References Cited

U.S. PATENT DOCUMENTS

| | | | |
|---|---|---|---|
| 3,816,107 | 6/1974 | Searight et al. | 65/30 |
| 3,838,998 | 10/1974 | Matthews et al. | 65/21 |
| 4,059,423 | 11/1977 | De Vos et al. | 65/21 |
| 4,063,916 | 12/1977 | De Vos et al. | 65/21 |
| 4,141,055 | 2/1979 | Berry et al. | 361/410 |
| 4,450,184 | 5/1984 | Longo et al. | 427/34 |
| 4,618,525 | 10/1986 | Chamberlain et al. | 428/209 |
| 4,620,264 | 10/1986 | Ushifusa et al. | 361/414 |
| 4,744,831 | 5/1988 | Beck | 106/288 |
| 4,781,968 | 11/1988 | Kellerman | 428/209 |
| 4,821,142 | 4/1989 | Ushifusa et al. | 361/395 |
| 4,906,514 | 3/1990 | Francis et al. | 428/209 |
| 4,917,857 | 4/1990 | Jaeckel et al. | 419/9 |
| 4,983,550 | 1/1991 | Goetz et al. | 501/33 |
| 5,021,287 | 6/1991 | Otagiri et al. | 428/212 |

FOREIGN PATENT DOCUMENTS

| | | |
|---|---|---|
| 57-89212 | 6/1982 | Japan . |
| 59-11345 | 6/1984 | Japan . |
| 59-111345 | 6/1984 | Japan . |
| 61-83674 | 4/1986 | Japan . |
| 61-151063 | 7/1986 | Japan . |
| 62-40791 | 2/1987 | Japan . |
| 62-206861 | 9/1987 | Japan . |
| 62-287658 | 12/1987 | Japan . |
| 63-358 | 1/1988 | Japan . |
| 63-107095 | 5/1988 | Japan . |
| 63-151645 | 6/1988 | Japan . |
| 1-179740 | 7/1989 | Japan . |
| 2-83995 | 3/1990 | Japan . |

Primary Examiner—Patrick J. Ryan
Assistant Examiner—Cathy K. Lee
Attorney, Agent, or Firm—Staas & Halsey

[57] ABSTRACT

A laminated multi-layer wiring board comprising alternate layers of a glass ceramic material and conductor pattern. The glass ceramic layers are made of a glass ceramic comprising glass and dispersed ceramic particles. The glass ceramic layers further contain hollow or porous silica glass spheres dispersed in the glass ceramic. The hollow or porous silica glass spheres are covered with a ceramic coating layer containing aluminum as a constituent element. Such a structure prevents crystallization of the silica spheres and the resultant rapid increase in the thermal expansion coefficient of the glass ceramic layer. The structure also procludes the formation of pores in the surfaces of the spheres.

9 Claims, 3 Drawing Sheets

MULTI-LAYER WIRING BOARD

BACKGROUND OF THE INVENTION

1. Field of the Invention

The present invention relates to a glass ceramic multi-layer wiring board including a circuit pattern of an excellent conductor such as copper and having a low dielectric constant and a process for making a glass ceramic green sheet to be used in the multi-layer wiring board.

2. Description of the Related Art

To treat a large quantity of information at a high speed the frequency of signal is increased and often an optical communication means is utilized.

In a multi-layer wiring or circuit board having an electric circuit for treating such high speed signals, the retardation time $\tau$ of electric signals must be as short as possible and cross-talk between the conductor lines must be as low as possible, and accordingly, the electric constant of the board must be small, as shown in the following formula (1):

$$\tau = \epsilon^{\frac{1}{2}}/C \ldots \quad (1)$$

where $\epsilon$ is a dielectric constant of the board and C is a velocity of the light. Also, to lower transmission loss, the formation of an electric circuit on and in the board by a pattern of a metal material having a low electric resistance is necessary.

The inventors et al., proposed the use of a glass ceramic as a material of a board, and copper as the material of an electric circuit. Green sheets containing a ceramic such as alumina ($Al_2O_3, \epsilon = 10$) and mullite ($3Al_2O_3 \cdot 2SiO_2$, $\epsilon = 7$) as a main component require a firing temperature of more than 1000° C., but glass ceramic green sheets containing such ceramic powders and a glass such as borosilicate glass powder as main components can be fired at a temperature lower than 1000° C., which allows copper having a melting point of 1084° C. to be used as a conductor material of a circuit pattern.

Nevertheless, such glass ceramic boards have a dielectric constant of 4 to 6, which is not low enough to allow a shortening of the information retardation time.

The present invention relates to a multi-layer circuit board of a glass ceramic containing hollow or porous silica glass spheres dispersed therein. Such boards containing hollow or porous spheres dispersed therein are known, as described below.

Japanese Unexamined Patent Publication (Kokai) No. 59-111345 discloses a circuit board of a ceramic containing hollow spheres dispersed therein, and inorganic particles such as hollow alumina spheres are used as the hollow spheres.

Japanese Unexamined Patent Publication (Kokai) No. 62-206861 disclosss a ceramic multi-layer board having an insulating layer in which hollow ceramics particles are dispersed in a ceramic matrix and which has a dielectric constant of less than 5 and a bending strength of more than 5 kg/mm². The hollow ceramic particles used are hollow silica spheres and the ceramic matrix used is originally amorphous and forms crystals in the matrix when subjected to a heat treatment, i.e., becomes a crystallized glass, to thus improve the strength of the board.

Japanese Unexamined Patent Publication (Kokai) No. 62-287658 discloses a multi-layer circuit board having alternately laminated ceramic layers and wiring layers, in which the ceramic layers comprise a glass having a softening point lower than the melting point of the wiring layer and hollow silica particles having a diameter of less than 100 μm dispersed in the glass matrix.

Japanese Unexamined Patent Publication (Kokai) No. 2-83995 discloses a multi-layer circuit board having wiring layers alternately laminated with insulating layers therebetween, in which the insulating layers have two regions having different porosities and the region having a larger porosity is in contact with the wiring layer.

Japanese Unexamined Examined Patent Publication (Kokai) No. 63-358 teaches a low dielectric constant material in the form of a thick film comprising an approximately uniform mixture of hollow glass spheres with a glass ceramic. The hollow glass spheres, glass ceramic and an organic vehicle are mixed and coated on a support layer of, for example, alumina having a metal pattern formed thereon, and then dried to obtain an insulating board.

As shown above, many concepts of using hollow spheres in an insulating matrix have been disclosed, but none of them discloses a countermeasure to a crystallization of silica spheres, to form cristobalite causing a rapid increase of the thermal expansion coefficient, or a countermeasure to a formation of pores in the surface of the silica spheres by a heat treatment. The above publications, however, accelerate the crystallization of the silica spheres, to thus increase the strength of a board.

A ceramic multi-layer board composing an electric circuit required for a high speed transmission of signals, as in a supercomputer, must satisfy the following conditions:

(1) A metal material having a low electric resistance such as copper is used as the wiring or conductor material.

(2) The dielectric constant is as low as possible.

(3) The thermal expansion coefficient of the board is close to that o a silicon semiconductor.

The glass ceramic satisfies the conditions (1) and (3), but does not satisfy the condition (2). Namely, the glass ceramic has a firing temperature of less than 1000° C., thereby allowing a wiring pattern made of copper to be obtained. The thermal expansion coefficient is brought close to the $3.5 \times 10^{-6}$/° C. of silicon by appropriately selecting the glass as the starting material, for example, borosilicate, lead borosilicate or aluminoborosilicate. Nevertheless, the dielectric constant is disadvantageously as high as 4 to 6.

Thus, the purpose of the present invention is to provide a multi-layer board satisfying the above conditions (1) to (3), wherein the dielectric constant is not higher than 4.

SUMMARY OF THE INVENTION

The above object of the present invention is attained by providing a multi-layer wiring board comprising a laminate of glass ceramic layers and conductor patterns, said glass ceramic layers being made of a glass ceramic comprising a glass and ceramic particles dispersed therein, said glass ceramic layers further comprising hollow or porous silica glass spheres dispersed in the glass ceramic, said hollow or porous silica glass spheres being covered with a ceramic coating layer containing aluminum as a constitutional element.

A ceramic green sheet for the glass ceramic layers is made by combining and kneading hollow or porous silica glass spheres, glass powder, ceramic powder, a binder resin, a plasticizer and a solvent, and then forming the resultant slurry into a ceramic green sheet, wherein said hollow or porous silica glass spheres are covered with a ceramic coating layer containing aluminum as a constitutional element.

DESCRIPTION OF THE PREFERRED EMBODIMENTS

Figure 1:
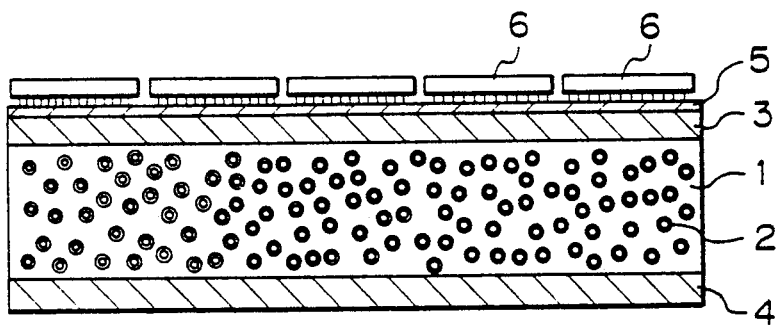
FIG. 1 is a sectional view of a multi-layer wiring board of the present invention.

The hollow or porous silica glass spheres used in the present invention are also called hollow or porous quartz glass spheres, because they contain more than 90% by weight, preferably more than 93% by weight, of silica, with the remainder being boron oxide or alkali metals, etc.

The silica has a dielectric constant $\epsilon$ of 3.8, the lowest among inorganic dielectrics, and the dielectric constant can be further reduced by a hollow or porous body of a composite of a composite of silica and air. The dielectric constant $\epsilon$ of the composite is as shown below:

$$\epsilon_0 = (\epsilon_1 \cdot \epsilon_2)/(\epsilon_1 V_2 + \epsilon_2 V_1) \ldots \quad (2)$$

where $\epsilon_0$ is a composite dielectric constant, $V_1$ is a ratio of a volume occupied by a dielectric having a dielectric constant $\epsilon_1$ (in this case: quartz) to the total volume of the composite and $V_2$ is a ratio of volume occupied by a dielectric having a dielectric constant $\epsilon_2$ (in this case: air) to the total volume of the composite.

The hollow silica glass spheres or hollow quartz glass spheres may be made by a pyrolysis of an organic silicon compound such as methoxysilicate $Si(OCH_3)_4$ or ethoxysilicate $Si(OC_2H_5)_4$ during which a constituent component is separated and becomes balloons. Such hollow silica glass spheres are sold, for example, under the trade name of "Microballoon" by Fuji Davison Chemical Ltd. The porous silica glass spheres or porous quarts glass spheres may be made by pulverizing a porous mass of silica or quartz.

The hollow silica glass spheres have a softening temperature of 900 to 1000° C. or more, typically 950° C.

Hollow silica or quartz glass spheres having a particle size larger than 100 μm are used as a filler for concrete, or as a material for lowering the weight of resin articles. In the present invention, a hollow or porous silica having an average particle size not larger than 20 μm is used instead of the ceramic particles used in a glass ceramic, to thereby provide a multi-layer glass ceramic board having a low dielectric constant. Namely, a green sheet is made by using hollow or silica spheres and glass, as main components.

When these hollow or porous silica spheres are used, however, the following problems arise:

(1) When heated, the silica spheres are phase transformed into cristobalite, i.e., a crystallization occurs and the thermal expansion coefficient is rapidly increased to about $1 \times 10^{-5}$.

(2) Since the hollow silica spheres made by a pyrolysis of an organic silicon compound have a softening temperature of about 950° C., which is lower than that of a ceramic such as alumina, it is necessary to raise the softening temperature to about 1050° C. to obtain a reliable board.

To solve the above problems, according to the present invention, the hollow or porous silica spheres are covered with a ceramic coating layer containing aluminum as a constituent element, and a result:

(1) A crystallization of the silica glass is prevented by the presence of a ceramic coating layer containing aluminum as a constituent element. Although this has not been confirmed, it is assumed that the aluminum is diffused into or acts with the silica to prevent the crystallization of the silica glass, whereby a rapid increase of the thermal expansion coefficient and a formation of pores in the surface of the spheres, due to the crystallization, are prevented.

(2) The presence of a ceramic coating layer on the hollow or porous silica spheres enables an improvement of the softening temperature of the hollow or porous silica spheres to 1050° C.

The ceramic coating layer containing aluminum as a constituent element may be formed of alumina, mullite, spinel, aluminum nitride, etc. as long as it contains aluminum as a constituent element and is a ceramic or has a softening or melting point higher than 1050° C.

The ceramic coating layer containing aluminum as a constituent element may be formed on the surface of the hollow or porous silica spheres by any known process, for example, by a chemical vapor deposition (CVD) or pyrolysis, or by plating a metal layer and then applying heat thereto to form an oxide, or by dipping the spheres in a slurry of a ceramic and then heating same, etc.

The surface of the hollow silica microspheres can be coated with an inorganic substance such as $Al_2O_3$ ceramic by the sol-gel method. If the microspheres are coated with aluminum isopropoxide: $Al[OCH(CH_3)_2]_3$ is used as a starting material.

To coat the surface of hollow silica microspheres with a alumina film according to the sol-gel method, 50 g of hollow silica microspheres having an average particle size of 10 μm were added to a solution prepared from 100 g of $Al[OCH(CH_3)_2]_3$, 140 g of $C_2H_5OH$, 80 g of $H_2O$ and 1.2 g of HCl. The Aluminum alkoxide solution was stirred to activate hydrolysis of the solution to some extent. At the time when the gelation of the solution was initiated, the solution, including the hollow silica microspheres, was dried by spray-drying. The resulting powder was heated to 1000° C. in the air in an electric furnace so that the coating film underwent a dehydration-condensation reaction to thus give a compact alumina film.

The thickness of the ceramics coating layer is not critical.

The hollow or porous silica spheres may be contained in an amount of up to 50% by volume, typically about 30% by volume, of the glass ceramic layer.

The glass ceramic of the glass ceramic layers comprises glass and ceramic particles dispersed in the glass. The glass has a softening temperature of about 700° to 900° C., i.e., the glass is softened but not fused at a firing temperature of the glass ceramic layers. Such a glass may be, for example, borosilicate glass, lead borosilicate glass or aluminoborosilicate glass. The borosilicate glass typically has a relatively low dielectric constant of 4.1 to 4.6.

The ceramic particles are used in the glass ceramic for a reinforcement and a prevention of a crystallization thereof. Examples of the ceramic particles are alumina ($\epsilon = 10$), mullite ($\epsilon = 7$), spinel, aluminum nitride, etc. An average particle size of the ceramic particles is generally up to 10μm, preferably 3 to 4μm, and the amount of the ceramic particles is generally up to 50% by volume, preferably 20 to 40% by volume, more preferably 25 to 35% by volume, of the glass ceramic layer.

The glass ceramic layer is made by firing a green sheet of a glass ceramic. The green sheet for the glass ceramic layer of the present invention may be made by combining and kneading hollow or porous silica glass spheres, a glass powder, a ceramics powder, a binder resin, a plasticizer and a solvent, and then forming the resultant slurry into a ceramic green sheet wherein the hollow or porous silica glass spheres are covered with a ceramic coating layer containing aluminum as a constitutional element.

The glass powders used have an average particle size of up to 10 μm, preferably 2 to 3 μm, and the process used for making a green sheet is the same as the conventional process except for the addition of the hollow or porous silica glass spheres. A typical thickness of the green sheet is 600 to 300 μm.

The green sheet is cut to a predetermined size and laminated alternately with conductor patterns, to thus form a laminate. The number of layers of the laminate is, for example, 70 to 80, and after through holes are formed in the laminate, the laminate is fired.

A preferred conductor is copper, but white silver and platinum, etc., may be used.

The firing temperature of a copper conductor is 900° to 1010° C., typically 980° C., and the firing atmosphere is wet nitrogen, but air may be used for silver or platinum, etc.

The glass ceramic green sheet comprising borosilicate glass and ceramic particles may be fired at 1010° C., but if hollow or porous silica glass spheres without the ceramic coating layer of the present invention are added to the glass ceramic green sheet, the firing temperature should be lowered to 960° C., to ensure a good densification when sintered. If the density of the sintered board is lowered, the strength of the board is lowered and the water absorption rate is increased, and thus the reliability of the board is lowered. Nevertheless, by adding hollow or porous silica glass spheres covered with the ceramic coating layer of the present invention to the glass ceramic green sheet, the firing temperature may be, for example, 980° C. to 1010° C., and the board can be densely sintered without the occurrence of problems such as a crystallization of the silica spheres.

When manufacturing a multi-layer board, the top and bottom surfaces are polished to provide a smooth surface on which a circuit pattern is to be formed. If the glass ceramic contains hollow or porous spheres, and the surfaces of the board are polished, pores will be formed in the surface of the hollow or porous spheres and the surfaces of the board will be roughened. To solve this problem, a small number of glass ceramic layers comprising a glass ceramic and ceramic particles, but not containing hollow or porous spheres, are further laminated on both surfaces of the laminate of glass ceramic layers comprising a glass ceramic and ceramic particles as well as hollow or porous spheres, and thus the surfaces of the laminate or board remain smooth after polishing. Of course, the content of ceramic particles in the layers on both sides of the board may be increased, because the hollow or porous spheres are eliminated.

FIG. 1 shows a structure of a multi-layer wiring board of the present invention. In the figure, the body of the multi-layer wiring board 1 comprises a laminate of wiring layers (not shown) and glass ceramic layers containing hollow silica spheres 2, and glass ceramic layers 3 and 4 are formed on both surfaces of the body of the multi-layer wiring board 1 and polished, and a circuit pattern of a conductor 5 is formed on those surfaces and LSI's 6 are mounted the circuit pattern.

EXAMPLES

Example 1

Hollow silica spheres (Microballoon sold by Fuji Davison Chemical Ltd.) having an average particle size of 20 μm and aluminum sulfate $Al_2(SO_4)_3$ were mixed and dried to deposit an aluminum sulfate layer $Al_2(SO_4)_3$ on the surface of the hollow silica spheres. The spheres were then heated at 1000° C. to obtain hollow silica spheres having a layer of $Al_2O_3$ coated on the surfaces thereof.

The following composition was kneaded and formed into a green having a thickness of 300μm, by a doctor blade method.

| | |
|---|---|
| Coated hollow silica sphere | 100 g |
| Borosilicate glass | 200 g |
| Mullite particles | 200 g |
| Polyvinyl buthylal (binder) | 50 g |
| Dibutylphthalate (plasticizer) | 30 g |
| Metylethylketone (solvent) | 50 g |
| Acetone (solvent) | 100 g |

In this green sheet, a wiring pattern and through holes were formed of a Cu paste, 30 of the obtained green sheets were formed into a laminate, and green sheets made of silica particles instead of the hollow silica spheres were further laminated on the top and bottom surfaces thereof. The laminate was then subjected to an isotactic pressing at 10 MPa and heated in a nitrogen atmosphere at 1000° C., to obtain a multi-layer glass ceramic wiring board.

The thus obtained multi-layer glass ceramic wiring board was not deformed, and the silica spheres inside the board were not crystallized. The dielectric constant of the board was 3.5, and thus was suitable for use as a wiring board for a high frequency transmission.

Example 2

The procedures of Example 1 were repeated to obtain a multi-layer glass ceramic wiring board, except that aluminoborosilicate glass was used instead of borosilicate glass.

The obtained multi-layer glass ceramics wiring board was not deformed and the silica spheres inside the board were not crystallized. The dielectric constant of the board was about 3.5, and the thermal expansion coefficient of the board was $3.5 \times 10^{-6}$, i.e., the same as that of silicon.

Figure 2:
FIG. 2 to 4 show photographes of conventional silica spheres after heat treated at 1100° C., taken by an SEM.
Figure 3:
Figure 4:
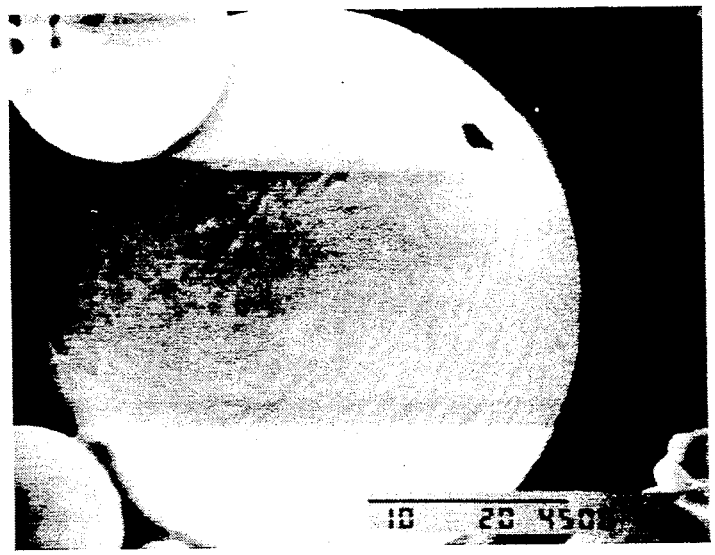
Figure 5:
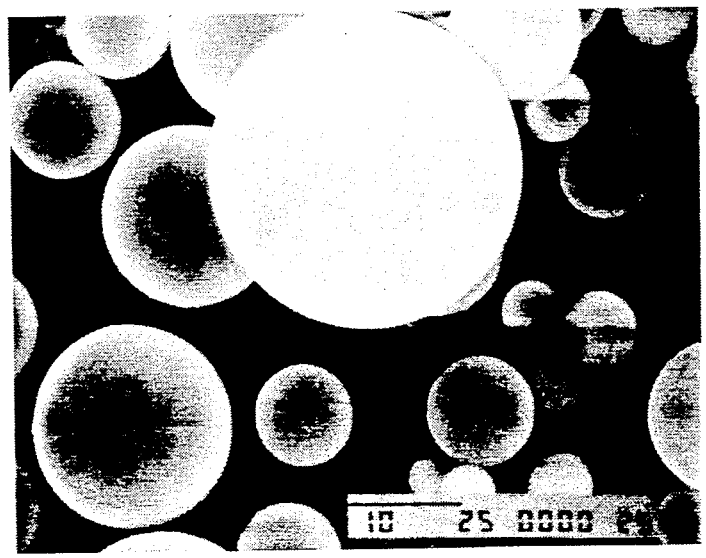
FIG. 5 shows a photograph of silica spheres with an $Al_2O_3$ coating after heat treated at 1100° C., taken by an SEM.

FIGS. 2 to 4 are photographs of silica spheres without a ceramic coating after heat treated at 1100° C., taken by an SEM. The magnitudes of the photographs are ×500 in FIG. 2, ×1000 in FIG. 3, and ×5000 in FIG. 4. These photographs in FIGS. 2 to 4 clearly show the phase separation and pores. FIG. 5 is a photograph of silica spheres with an Al₂O₃ coating after heat treated at 1100° C., taken by an SEM at a magnitude of ×1000. The photograph in FIG. 5 shows that no phase separation occured and pores formed.

We claim:

1. A multi-layer wiring board comprising alternate layers o a glass ceramic material and conductor patterns, said glass ceramic layers being image up of a fired admixture comprising a glass ceramic matrix and a multitude of ceramic particles which are dispersed in the glass ceramic matrix, said ceramic particles comprising hollow or porous silica glass spheres having an average diameter of not more than 20 μm are covered with an aluminum containing ceramic coating layer.

2. A multi-layer wiring board according to claim 1, wherein said ceramic coating layer comprises alumina, mullite, spinel or aluminum nitride.

3. A multi-layer wiring board according to claim 1, wherein said hollow or porous silica glass spheres comprise more then 90% by weight of silica.

4. A multi-layer wiring board according to claim 1, wherein said hollow or porous silica glass spheres are contained in the glass ceramic layers in an amount of not more than 50% by volume.

5. A multi-layer wiring board according to claim 1, wherein said glass ceramic has a softening temperature of 700° to 900 ° C., and said dispersed ceramic particles have an average particle size of not more than 10 μm and are contained in the glass ceramic layers in an amount of not less than 10% by volume.

6. A multi-layer wiring board according to claim 1, wherein said conductor patterns are formed from copper.

7. A multi-layer wiring board according to claim 1, wherein said multi-layer board further includes additional glass ceramic layers formed of the top and bottom surfaces of said glass ceramic layers, said additional glass ceramic layers containing glass and ceramic particles dispersed in the glass, but not containing hollow or porous silica glass spheres.

8. A multi-layer wiring board according to claim 7, wherein said additional glass ceramic layers are polished and circuit patterns are formed on polished surfaces of said additional glass ceramic layers.

9. A green sheet for use in preparing a glass ceramic material or a multi-layer wiring board comprising alternate layers of a glass ceramic material and conductor patterns, said green sheet comprising an unfired admixture of a glass powder, a ceramics powder and a multitude of ceramic particles dispersed in the admixture, said ceramic particles comprising hollow or porous silica glass spheres having an average diameter of not more than 20 μm are covered with an aluminum containing ceramic coating layer.

* * * * *

UNITED STATES PATENT AND TRADEMARK OFFICE
CERTIFICATE OF CORRECTION

PATENT NO. : 5,275,889  Page 1 of 2
DATED : January 4, 1994
INVENTOR(S) : KISHIO YOKOUCHI et al.

It is certified that error appears in the above-identified patent and that said Letters Patent is hereby corrected as shown below:

Item [57], col. 2,
Title page, in the Abstract, line 12, "procludes" should be --precludes--.

Column 2, line 14, delete "Examined".

line 42, delete "o" and insert --of--.

Column 3, line 34, (equation 2), delete "$(\epsilon_1 V_2 + "_2 V_1) \ldots$" and substitute --$(\epsilon_1 V_2 + \epsilon_2 V_1) \ldots$--;

line 51, delete "quarts" and substitute --quartz--.

Column 6, line 14, after "mounted" insert "on";

line 28, after "green" insert "sheet".

UNITED STATES PATENT AND TRADEMARK OFFICE
CERTIFICATE OF CORRECTION

PATENT NO. : 5,275,889
DATED : January 4, 1994
INVENTOR(S) : Kishio Yokouchi, et. al.

It is certified that error appears in the above-indentified patent and that said Letters Patent is hereby corrected as shown below:

Column 7, line 9, delete "o" and substitute --of--.

Signed and Sealed this

Nineteenth Day of July, 1994

Attest:

BRUCE LEHMAN

Attesting Officer

Commissioner of Patents and Trademarks